(12) United States Patent
Zahlmann et al.

(10) Patent No.: US 11,454,653 B2
(45) Date of Patent: Sep. 27, 2022

(54) DEVICE FOR DETECTING ELECTRICAL CURRENTS ON OR IN THE VICINITY OF ELECTRICAL CONDUCTORS

(71) Applicant: DEHN SE + CO KG, Neumarkt/Opf. (DE)

(72) Inventors: Peter Zahlmann, Neumarkt (DE); Josef Birkl, Berching (DE); Thomas Böhm, Hohenfels (DE); Klaus Bühler, Eckental (DE); Johannes Maget, Parsberg (DE); Arnd Ehrhardt, Neumarkt/Opf. (DE); Eduard Shulzhenko, Ilmenau (DE)

(73) Assignee: DEHN SE + CO KG, Neumarkt/Opf. (DE)

( * ) Notice: Subject to any disclaimer, the term of this patent is extended or adjusted under 35 U.S.C. 154(b) by 0 days.

(21) Appl. No.: 17/040,840

(22) PCT Filed: May 23, 2018

(86) PCT No.: PCT/EP2018/063426
§ 371 (c)(1),
(2) Date: Sep. 23, 2020

(87) PCT Pub. No.: WO2019/185172
PCT Pub. Date: Oct. 3, 2019

(65) Prior Publication Data
US 2021/0025927 A1     Jan. 28, 2021

(30) Foreign Application Priority Data

Mar. 28, 2018 (DE) .......................... 102018107481.6
May 11, 2018 (DE) .......................... 102018111308.0

(51) Int. Cl.
*G01R 19/165* (2006.01)
*G01R 29/08* (2006.01)

(52) U.S. Cl.
CPC ... *G01R 19/16509* (2013.01); *G01R 29/0842* (2013.01)

(58) Field of Classification Search
CPC . G01R 19/16509; G01R 29/0842; G01R 9/06
See application file for complete search history.

(56) References Cited

U.S. PATENT DOCUMENTS

| | | | |
|---|---|---|---|
| 3,505,869 A * | 4/1970 | Crawford | G01F 23/70 73/313 |
| 4,101,826 A | 7/1978 | Horsitmann | 324/543 |
| 10,852,339 B2 | 12/2020 | Birkl et al. | |

FOREIGN PATENT DOCUMENTS

| | | | |
|---|---|---|---|
| DE | 2700995 A1 | 7/1978 | ............. B60Q 11/00 |
| DE | 2826247 C2 | 3/1984 | ........... G01R 19/165 |

(Continued)

OTHER PUBLICATIONS

The Notification Concerning Transmittal of International Preliminary Report on Patentability (Chapter I of the Patent Cooperation Treaty), in English, dated Oct. 8, 2020, which was issued by the International Bureau of WIPO in Applicant's corresponding international PCT application having Serial No. PCT/EP2018/063426, filed on May 23, 2018.

*Primary Examiner* — Daniel C Puentes
(74) *Attorney, Agent, or Firm* — Bodner & O'Rourke, LLP; Gerald T. Bodner; Christian P. Bodner (57) ABSTRACT

The invention relates to a device for detecting electrical currents on or in the vicinity of electrical conductors with at least one Reed switch as a magnetically responsive switch, which is arranged in the vicinity of the electrical conductor such that, when there is a significant current flow through the conductor, the magnetic field created triggers the switch and initiates an evaluation electronics connected to the switch. For the detection of surge current variables and the differentiation between long-term pulsed currents and short-term (Continued)

pulsed currents, a plurality of Reed switches are arranged at a predetermined distance from the electrical conductor, wherein the evaluation electronics determines the response and the switching times of the respective Reed switches, determines die surge current variable from the allocation of the determined values to the respective Reed switch and the pulse form from the switching time, wherein, for the purpose of adjusting the response behavior, at least one of the Reed switches comprises a shielding for influencing the magnetic field acting on the respective Reed switch.

14 Claims, 5 Drawing Sheets

(56) References Cited

FOREIGN PATENT DOCUMENTS

| | | | | |
|---|---|---|---|---|
| DE | 4430382 | A1 | 2/1996 | ............ H01H 71/04 |
| DE | 19733268 | A1 | 2/1999 | ............... H02H 3/08 |
| DE | 19930089 | A1 | 1/2001 | ............ H01H 71/10 |
| DE | 10329223 | A1 | 1/2005 | ............ H01H 71/24 |
| DE | 10329223 | B9 | 5/2006 | ............ G01R 15/18 |
| DE | 102010038856 | A1 | 2/2012 | ............ H01H 36/00 |
| EP | 1065690 | A2 | 1/2001 | ............ H01H 71/10 |
| JP | S488281 | A | 2/1973 | |
| JP | S49105868 | U | 9/1974 | |
| JP | S56110734 | U | 8/1981 | |
| JP | S57106337 | A | 7/1982 | |
| JP | 2007303952 | A | 11/2007 | |
| WO | WO2017036793 | A1 | 3/2017 | ............ F03D 17/00 |

* cited by examiner

DEVICE FOR DETECTING ELECTRICAL CURRENTS ON OR IN THE VICINITY OF ELECTRICAL CONDUCTORS

The invention relates to a device for detecting electrical currents on or in the vicinity of electrical conductors with at least one reed contact as a magnetically responsive switch, which is arranged in the vicinity of the electrical conductor such that, when there is a significant current flow through the conductor, the developing magnetic field triggers the switch and initiates an evaluation electronics connected to the switch, according to claim 1, and use of such a device for detecting and classifying lightning current and overcurrent events according to claim 14.

From DE 2 826 247 C2, a short-circuit indicator for electrical lines is already known.

The short-circuit indicator has a reed contact controlled by the magnetic field of an electrical line and an electronic self-holding circuit. The self-holding circuit is formed as a flip flop circuit controlling both an electronic counter and a clock generator. The clock generator triggers a flashlight signal generator. The electronic counter resets the flip flop circuit after expiration of time and stops the clock generator.

The employed reed contact is arranged in a plane parallel to the current conductor such that, in the moment of a short circuit, a correspondingly large magnetic field is generated which acts upon the reed contact and closes it at least for a short time.

Thus, a supply voltage reaches the input of the flip flop circuit so that it transitions into the self-holding position.

By twisting the reed contact about the imaginary longitudinal axis of a housing, its sensitivity is reduced. This allows the short-circuit indicator to be set in the factory to certain stepped tripping currents, for example, in the range of 200 to 400 A.

DE 103 29 223 B9 discloses a short circuit sensor, which utilizes the force of the magnetic field of a short circuit current to close a reed contact, which is mounted on a printed circuit board such that it is settable to a certain triggering current by being rotated between 0 and 90°.

DE 27 00 995 A1 concerns a monitoring system for an electrical load through which current flows.

The load refers in particular to brake or tail lights of automobiles. In the magnetic field generated by the current flowing through the supply line of the load, a switch that is dependent on the magnetic field is arranged, which leads to a display device. As the switch, in particular a reed contact is used.

In a preferred embodiment, the switch is arranged inside a coil formed by the load supply line, so that the magnetic field surrounding each individual conductor of the adjacent coil windings overlaps so as to obtain a sufficient response sensitivity.

In a realization of the teaching therein, the coil and the switch which can be actuated dependent on the magnetic field are combined as a structural unit, which can be looped into the supply line of the load.

In the arrangement for selectively triggering series-connected, selectively started circuit breakers, in which a circuit breaker directly affected by the short circuit outputs a blocking signal to a triggering system according to DE 199 30 089 A1, a reed contact is magnetically coupled to each main circuit of a downstream circuit breaker and is electrically connected to the triggering system of the upstream circuit breaker.

The protective tube contact preferably is arranged in the vicinity of a connection terminal of the circuit breaker.

The solutions of the state of the art depicted above have in common, that a reed contact forms the basis of a switch, wherein the switch is actuatable by a magnetic field. With sufficient magnetic energy, the contact reeds of a reed switch known per se will get into a contact closing position, with the consequence that the electric circuit, in which the switch is located, will be closed. On the basis of employing such reed switches, electric circuits can be monitored and their function be signalized.

Moreover, a short circuit current can be determined in that the short circuit current itself is defined as a threshold value, the magnetic field of which is capable of closing the reed contact, viz the switch.

From the aforementioned, it is a task of the invention to propose a further developed device occupying only a small installation space for detecting electrical currents on or in the vicinity of electrical conductors with at least one reed contact as a magnetically responsive switch, wherein the device is not only capable of defining a switching state when a certain current flow is reached in the electrical conductor, but there is also the possibility of detecting current pulses and surge currents and of evaluating them without, as it is the case with so-called lightning counters, complicated electronic and thus expensive and fault-prone circuits being required.

The solution of the task of the invention is performed by a device according to the feature combination according to claim 1, as well as the use according the teaching according to claim 14, with the dependent claims representing at least appropriate configurations and further developments.

As a result of extensive studies, it has been shown surprisingly that by means of a quasi spatially staggered arrangement of a plurality of reed contacts that is spaced with respect to an electrical conductor and/or graduated in its sensitivity, surge current variables can be determined and differentiated. In this case, it has been shown in a particularly surprising manner that not only long-term pulse currents are recognizable but also short-term pulse currents can be evaluated. In this case, the device according to the invention works in a trouble-free manner also in a rough environment and under the influence of mechanical shocks and vibrations, which in turn is surprising with regard to certain applications, for example the monitoring of lightning strikes in wind turbines.

Due to their construction, reed contacts per se have mechanical inertia, which does not allow the reproducible response to be expected during extremely short-term pulse loads. The determined defined response of the sensitive contacts, in part already during the pulse process, is just as unpredictable as the likewise reproducible response of contacts having lower sensitivity or higher mechanical inertia even significantly after the pulse load without any magnetic field of further impact. The overload resistance, in particular of the sensitive reed contacts moreover is surprising. Pulse currents of <100 A as well as small long-term currents can be safely detected. In case of significantly larger pulse loads of up to 250 kA with magnetic loads, which are above the response voltage by the factor of 1000 or more, the mechanical components of the respective reed contact will not be mechanically destroyed nor damaged by the high dynamic forces, so that a reproducible detection of pulse currents is possible even after such multiple loads.

Positioning the respective reed contact in accordance with the invention and feeding the connections in a manner almost free from loops allows a disadvantageous coupling of currents into the path of the contacts to be reduced to an extent that the necessary sensitive contacts of very low switching currents will not be damaged by the currents induced during closing together with possibly high-frequency bouncing due to avoiding demolition sparks. A sparking can be avoided by additional wirings of the reed contact. An undesired coupling of currents into the connection loop of the reed contacts can be reduced by active or passive overvoltage protection measures.

The device according to the invention for detecting electrical currents using reed contacts may be integrated into a so-called smart arrester rod or may represent an integral part of such an arrester rod so as to be able to evaluate lightning events.

According to a further application example, the device according to the invention for detecting currents may be used in such conductors, which are an integral part of a construction and are utilized according to EN 62305-3 as an arresting device. The reed contacts may also be installed on or in the vicinity of electrically conductive constructional parts, which in principle are not provided for lightning protection but across which a partial lightning current might flow. By way of example, reference should be made to hoisting cables of cableways, holding ropes of cranes and the like. Concerning this matter, a potential damage by partial lightning currents can be recognized successfully at an early stage so as to initiate appropriate measures, for example, the exchange of damaged ropes or cables.

The galvanic separation resulting from the use of the reed contacts and the distance of the device together with its electronic components from the arrester through which lightning current flows, enables a trouble-free operation over a long period without any maintenance effort.

Likewise, the device according to the invention may be an integral part of overvoltage arresters or be used for evaluating the load of overvoltage arresters, in that the device according to the invention is integrated into or allocated to the respective current path.

Thus, the device according to the invention represents a cost-effective alternative to otherwise used complicated measurement systems using, for example, so-called Rogowski coils.

The device according to the invention enables in its application a double function to be achieved, in that, on the one hand, parasitic current pulses, for example on the basis of lightning events are detected, and these can be differentiated with respect to the pulse shape and pulse duration but also the current level.

The device for detecting electrical currents on or in the vicinity of electrical conductors consequently takes a reed contact as a magnetically responsive switch as a basis, which is arranged in the vicinity of the electrical conductor in such a way that in case of a significant current flow through the conductor the developing magnetic field triggers the switch and initiates an evaluation electronics connected to the switch.

According to the invention, a plurality of reed contacts is arranged in a pre-defined distance from the electrical conductor for detecting surge current variables and differentiating long-term pulse currents, on the one hand, and short-term pulse currents, on the other.

Moreover, according to the invention, for setting the response behavior, at least one of the reed contacts is provided with a shield for influencing the magnetic field acting upon the respective reed contact.

The evaluation electronics determines the response and the switching times of the respective reed contacts. From the allocation of the determined values to the reed contact, respectively its spatial arrangement and the distance from the electrical conductor, the surge current variable, and from the switching time the pulse shape can be detected or determined preferably using a microcontroller.

According to the invention, not only reed contacts having a closing function can be used. There is likewise the possibility of utilizing opening reed contacts. Corresponding opening contacts can be realized in conjunction with a permanent magnet such that the response behavior of the contact is settable.

It is therefore in the sense of the invention to set the response behavior regarding the differentiation of the currents not only by a spatially spaced configuration, but also to refer to further criteria. For setting limits to the response behavior of the respective reed contacts, the shield mentioned above is proposed. This shield may be realized as a metallic sleeve or metallic layer. Against high-frequency processes, for example, metallic sleeves or layers on the basis of copper or aluminum materials are purposeful for generating eddy currents. For reducing the sensitivity in case of low-frequency processes, materials of high permeability, for example, magnetically soft steels may be used.

For utilizing both effects, materials having high permeability in addition to electrically conductive coatings, for example of copper, can be used. Due to the saturation of materials of high permeability in case of strong magnetic fields, a graduation of the shielding materials surrounding the respective reed contact is advantageous.

Due to the shield, the sensitivity of the reed contacts thus can be set and changed individually so that the use of standard reed contacts having the same sensitivity and an identical design becomes possible.

Due to the limits of a different spatial spacing of the reed contacts from the electrical conductor, opening contacts of the same design with different opposing field magnets may be used as an alternative or a complement. Likewise, the use of closing contacts is possible which, apart from the distance, are shielded against the effect of magnetic fields.

In one embodiment of the invention, the electrical conductor is an integral part of a lightning current arresting system, an arrester rod or a conductive constructional part through which lightning current may flow in principle.

In a further embodiment of the invention, the electrical conductor is an integral part of a surge current carrying overvoltage arrester.

Apart from the preferred microcontroller, the evaluation electronics also features a data storage.

The stored data can be transferred in a wireless or wired manner or by means of fiber optics (OWG) to a superordinate unit for long-term analysis of pulse-shaped surge currents or long-term currents.

Hereby it is possible, for example by integrating a plurality of devices according to the invention into complex buildings, to detect, store and evaluate loads regarding overcurrent events for site or risk analysis.

In order to ensure a permanent maintenance-free use of the device, it is equipped with a long-term current supply.

Since the device according to the invention usually is in a so-called sleep mode and is only activated when overcurrent events occur, only extremely low standby currents will occur resulting in the desired long times of use without any change of a battery or accumulator.

In one configuration of the invention, the device according to the invention can also draw energy from the grid to which the current carrying conductor usually is connected.

The necessary energy for pulse registration or for operating the evaluation circuit may be obtained from the actual interfering signal or measurement signal, viz from the pulse itself.

An alternative possibility of obtaining operational energy is the so-called energy harvesting. In this case, energy generation may be realized from a movement or else by falling back on photovoltaic elements.

In a further development of the invention, the device features a radio module for data transmission, wherein, according to the invention, the data transmission is only triggered after expiration of a predetermined period of time after the last surge current pulse has decayed. In this manner, an interference-free data transmission is ensured.

In one embodiment of the invention, at least the reed contacts are fixed on a planar wiring carrier, for example a copper-coated printed circuit board.

In a preferred realization of the invention, the angular position of the groups of reed contacts with respect to the electrical conductor is fixedly predefined and not variable so as to achieve reproducible measurement results.

Furthermore, a housing accommodating the components of the device is formed according to the invention, which housing has a front or side surface provided with means for identifying the position of and/or attaching the electrical conductor.

In this way, a correct allocation between the field developing around the conductor and the reed contacts located within the housing in case of a current flow is ensured when the device is used or mounted on or in the vicinity of an electrical conductor.

Since the housing does not need to have openings for receiving or passing through the electrical conductor, it can be configured for highest protection levels, viz for being used outdoors and under critical environmental conditions.

In a special variant of the device according to the invention, it is configured such that an arrangement takes place on or in the vicinity of lightning arrester cables of rotor blades in wind turbines. By means of a subordinate counter device, the number but also the intensity and the pulse shape of lightning current events can be detected so as to conclude from this if the so-called receptors located at the upper surface of rotor blades of wind turbines possibly have already been excessively loaded or melted so that a maintenance assignment or a repair can be scheduled.

The device of the invention can also be utilized for monitoring and evaluating potential lightning strikes in hoisting cables, for example of cableways. The detection of the lightning currents in the hoisting cables is realized by correspondingly arranged and configured sensors with reed contacts in the sense of the explained teaching. When lightning currents or partial lightning currents have been detected, a notification to a superordinate control mechanism takes place. From this, the necessity of a check of the hoisting cable may then be concluded and, if required, an operation interruption be ordered. The detection of long-term currents is particularly problematical in such applications. Long-term currents are essential for melting processes occurring on the hoisting cable, which are especially possible during winter thunderstorms.

The proposed energy-autonomous mode of operation of the detection device according to the invention without any galvanic connection to a supply network has the advantage that separation distances from the measurement device do not need to be observed.

The use according to the invention of the presented device is targeted toward the detection and classification of lightning and overcurrent events, even of that kind which are not caused by lightning surge currents, but feature a surge current character in the range of >50 A to up to 200 kA, and a detection of events of the pulse shapes as long-term pulses with T≥10 ms and pulse shapes of the kind of 10/350 µs and 8/20 µs.

The invention will be explained below in more detail on the basis of an exemplary embodiment as well as of Figures in which:

Figure 1:
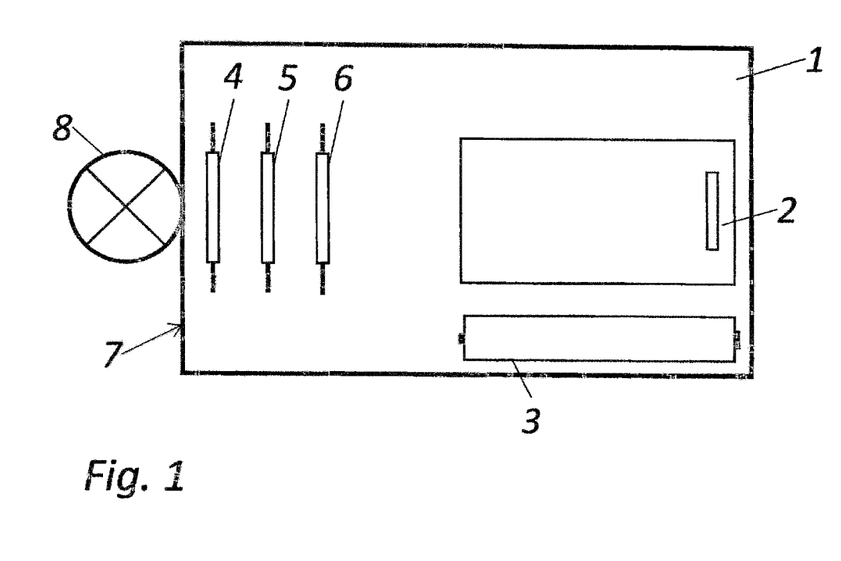
FIG. 1 shows a principle arrangement of the device according to the present disclosure with three reed contacts.

In this regard, FIG. 1 shows a principle arrangement of the device according to the invention with three reed contacts, for example at a defined distance from the electrical conductor.

Figure 2:
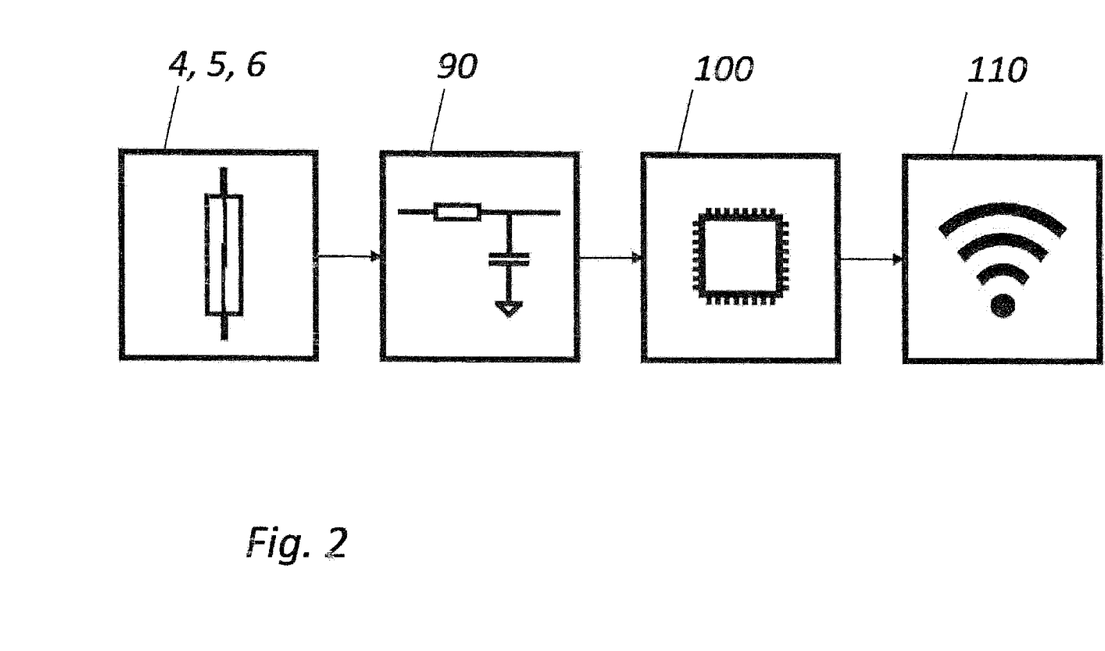
FIG. 2 shows a simplified block diagram of evaluation electronics of the device of FIG. 1.

FIG. 2 shows a simplified block diagram of the evaluation electronics with a low-pass filter 90 arranged downstream of the respective reed sensor 4; 5; 6, the respective output of said filter leading to a microcontroller 100 which is in communication with a radio interface 110 on its output side.

Figure 3:
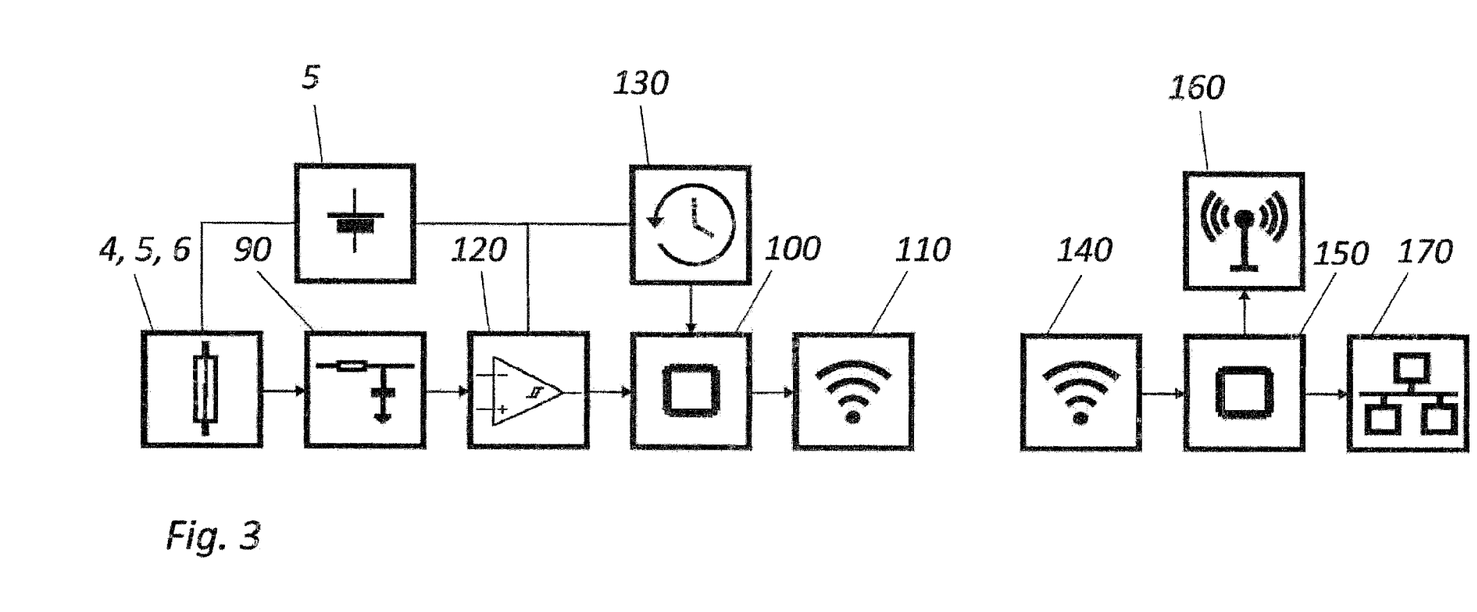
FIG. 3 shows a simplified block diagram of evaluation electronics of the device of FIG. 1 together with a processing and control unit being in communication with the evaluation electronics.

In the block diagram according to FIG. 3, reed sensors 4; 5; 6 are again taken as a basis, which are in communication with an R-C low-pass filter 90.

For determining the switching time of the respective reed sensor 4; 5; 6, the low-pass filters each are in communication with an input of a comparator 120, the output of which leads to the microcontroller 100 with a memory unit.

In this regard, a time module 130 is present leading to the comparison input of the comparator 120. For the voltage supply, the battery 5 already explained with respect to FIG. 1 is used. By means of the time module 130 and the microcontroller 100, the detected pulse shape can be determined from the switching time of the respective reed sensor or reed contact 4; 5; 6 in a signal processing manner.

The assemblies 110 and 140 form an air interface and ensure wireless data transmission of the detected surge current variables.

A further signal processing and control unit 150 is in communication with a communication module 160 in order to guarantee a cloud connection over GSM. Alternatively, a classical Internet connection for data evaluation as well as long-term analysis may be realized by means of the module 170.

The device according to the exemplary embodiment according to FIG. 1 takes a printed circuit board 1 as a basis, which has an evaluation unit with a radio module 2 as well as current supply of long-term stability in the form of a battery 3.

At or on a planar side section of the printed circuit board 1 or the wiring carrier, three spaced apart reed contacts 4, 5 and 6 are arranged located substantially in parallel to one another. For setting the response behavior, at least one of the reed contacts may have a shield.

An electrical conductor 8 is led to a quasi stop edge 7 of the printed circuit board 1. This may be, for example, an arrester cable of a rotor of a wind turbine.

If a surge current flows through the arrester cable 8, a magnetic field forms around the arrester cable, which penetrates the spaced apart reed contacts 4, 5, 6 at different intensities.

For example, it is assumed that the reed contact 4 has a distance of 5 mm from the conductor, the reed contact 5 has a distance of 15 mm from the conductor, and the reed contact 6 has a distance of 105 mm from the conductor.

The reed contact 4 is capable of detecting long-term pulses with an Imin≥50 A and a pulse duration of T≥10 ms. Likewise, the reed contact 4 in the closest distance from the arrester cable 8 can detect surge current pulses of the pulse shape 10/350 µs with Imin≥60 A and surge current pulses of the pulse shape 8/20 µs with Imin≥70 A.

The reed contact 5 is capable of detecting pulse currents of the pulse shape 10/350 µs with Imin≥200 A and pulse current of 8/20 µs with Imin≥750 A.

The reed contact relay 6 located in a distance of about 105 mm from the arrester cable 8 is capable of detecting pulses of the pulse shape 10/350 µs with Imin≥4.5 kA and pulses of the pulse shape 8/20 µs with Imin 67 kA.

With the help of the evaluation electronics integrated into the device, the different switching times of the reed contacts can be detected and evaluated depending on the pulse shape, so that it can be recognized, which pulse shapes having which pulse duration are concerned.

By the selective response of the reed contacts in case of corresponding surge currents, a differentiation in the range from about 60 A up to 250 kA can also be performed.

In case of a lightning or surge current event, this is first detected by at least one reed contact responding. After this, a differentiation of the measured current intensities is made by the response behavior of the individual reed contacts. The detected data is stored while observing the course of time or the time delta regarding subsequent events, and are then available for further evaluation.

With a device according to the invention and tested in a test field, the detectable minimum current intensity is at about 45 A. With the use of three reed contacts, for example, three pulse thresholds can be defined and evaluated. In case of a corresponding expansion of the microcontroller used for evaluation, a further diversification can be performed without leaving the basic principle of the invention.

Components for the long-term storage and analysis of the detected values, which possibly become necessary, may be attached spatially distant from the device according to the invention in EMI-protected premises. This is possible since preferably a wireless transmission of the measured values provided by the device to the downstream evaluation unit is performed, and this transmission is only triggerable after the last fault event has decayed.

By means of a fixedly set delay time between an occurring lightning event and the sending of the event protocol, a time allocation accurate to the millisecond or a time stamp accurate to the millisecond can be achieved.

The following exemplary threshold values of the reed contacts are the result of executed tests:

TABLE 1

| Triggering thresholds of the reed contacts | | | |
| --- | --- | --- | --- |
| Pulse shape | reed 1 | reed 2 | reed 3 |
| 8/20 µs | 350 A | 1250 A | 67 kA |
| 10/350 µs | 140 A | 260 A | 4.5 kA |
| DC test field | 140 A | — | — |

The triggering thresholds of the reed contacts may be greatly varied by the distance and the kind of the contacts. With these triggering thresholds, a differentiation can be made between an $I_{cc\ only}$ and a short-term pulse. If the $3^{rd}$ reed contact is intended to trigger at higher current intensity, the distance may even be increased. A deviation of the triggering threshold of 10 A could be observed in the different arresting cables (95 mm$^2$, Ø=11 mm, insulating wall thickness=2.5 mm, 50 mm$^2$, Ø=8 mm, insulating wall thickness=2.5 mm). As compared to 8/20 pulses, the triggering threshold is significantly lower at 10/350 pulses.

The following dependence of the response can be inter alia recognized between the triggering thresholds of the unshielded reed contacts of the pulses 8/20 and 10/350 has as of a certain distance from the arresting cable.

$$\frac{\int (I_{8/20}(t))^2 dt}{\int (I_{10/350}(t))^2 dt} \approx 15$$

Figure 4:
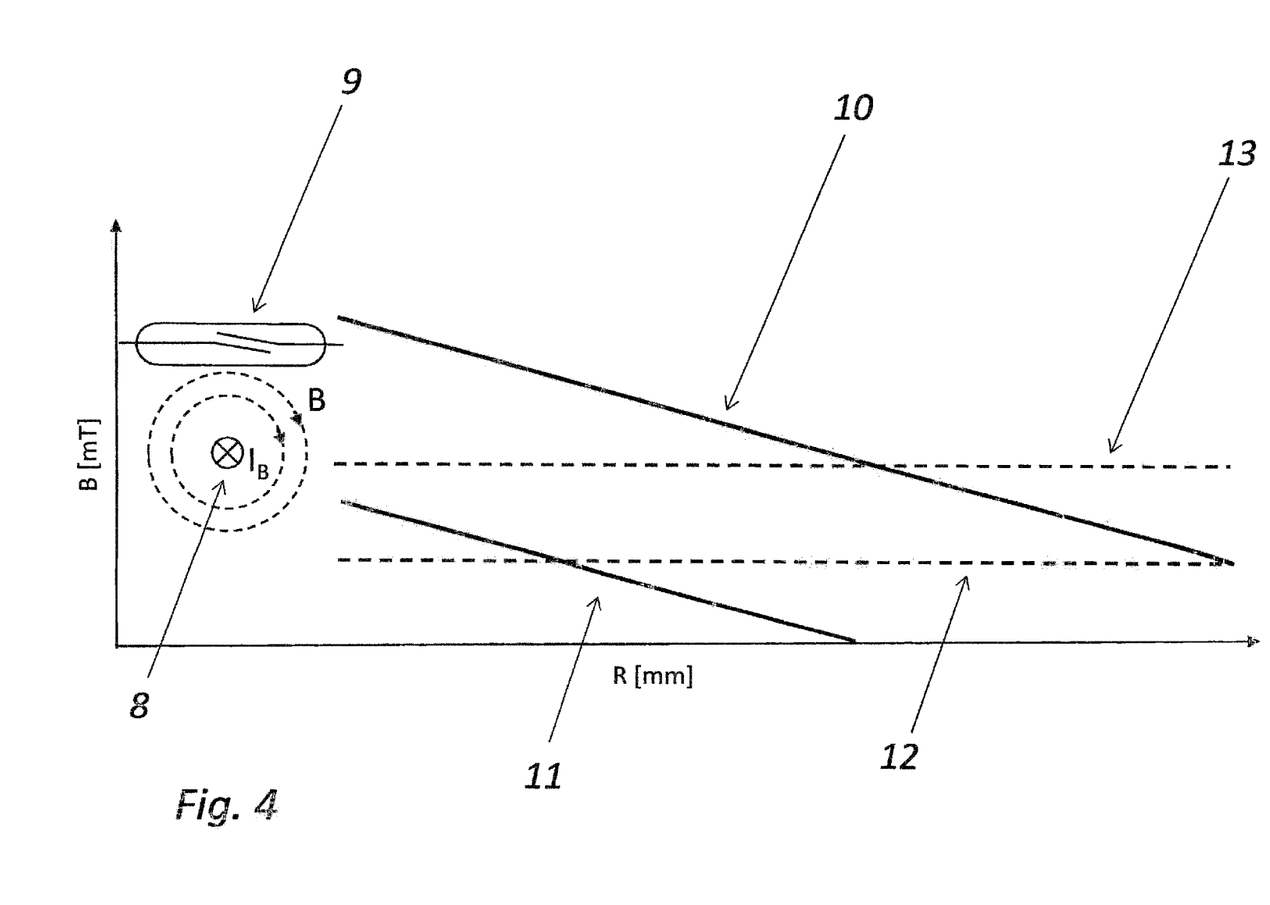
FIG. 4 schematically shows a level of a magnetic flux density as a function of a distance from a middle axis of a conductor cable.

According to FIG. 4, a cable through which current flows or a conductor 8 through which current flows is illustrated schematically with the surrounding magnetic field lines B. The corresponding reed contact 9 is radially oriented toward the magnetic field of the conductor 8 such that its connections and contacts are exposed to the magnetic flux density B. When the response flux density or the magnetic sensitivity of the reed contact 9 is reached, the contacts will close.

Reaching the response flux density of the reed contact 9 depends in this case on the current intensity within the cable 8, the distance of the reed contact 9, the sensitivity of the reed contact 9, and the orientation of the reed contact 9 toward the conductor cable 8.

Moreover, the response behavior may be changed by influencing the magnetic flux B, for example, by introducing materials of higher permeability.

In FIG. 4, the level of the magnetic flux density is shown in principle as a function of the distance R from the middle axis of the conductor cable 8. The illustrated axes are to be understood in a logarithmic way. The minimum distance of the reed contact 9 is in this case limited by the geometry of the conductor 8 and the necessary, possibly insulated attachment. In FIG. 4, line 10 represents the magnetic flux density for a high current intensity, and line 11 represents the magnetic flux density for a low current intensity. Line 13 characterizes the triggering threshold of a reed contact 9 of low sensitivity, and line 12 characterizes a sensitive reed contact 9.

In case of a small current flow and a correspondingly low magnetic flux density 11 through the conductor cable 8, the triggering threshold of a reed contact 9 of low sensitivity 13 will not be reached even in case of the smallest distance to be technically realized of the reed contact 9 from the conductor cable 8. A detection of the current will not be performed under these circumstances. Nevertheless, in order to cause a detection with such a reed contact 9, it is possible to increase the concentration of the magnetic field lines surrounding the conductor cable 8 coaxially in certain areas and being in contact with the connections of the reed contact, for example, by ferromagnetic materials.

Such an arrangement, however may be costly and possibly be avoided by using a more sensitive reed contact (line 12). Such a contact can detect the corresponding current or its magnetic flux density even at a distance of a few millimeters or centimeters. Only at larger distances or clearances, the magnetic flow density of the current (line 11) falls below the sensitivity of a corresponding reed contact (line 12), whereby a detection possibly is no longer possible.

On the contrary, in case of a high current, the magnetic flux density (line 10) up to a great distance is far above the high sensitivity of the reed contact (line 12). Due to the limited device size, such distances often are not practicable for a technical application.

The bandwidth of the sensitivity of available reed contacts is limited. It is moreover disadvantageous that the response time of the reed contacts generally rises with an increasing insensitivity, so that the desired detection of short-term pulse currents becomes not possible or only at significant temporal delays.

The magnetic flux density of long-term currents of a few 10 A and pulse currents of several 100 kA, however is greatly different, so that even in case of insensitive sensors at desired high detection threshold values in case of lightning currents, the necessary distances are considerable and can amount up to several meters resulting in restrictions of use.

In order to be able to realize high current thresholds for pulse currents and in particular lightning currents of the pulse shape of 10/350 µs in compact devices, the sensors can be provided with a complete or partial shield. For oriented sensitivity, the shields may also have windows. Thus, the shield has a weakening or a recess through which the magnetic field can partially penetrate.

Figure 5:
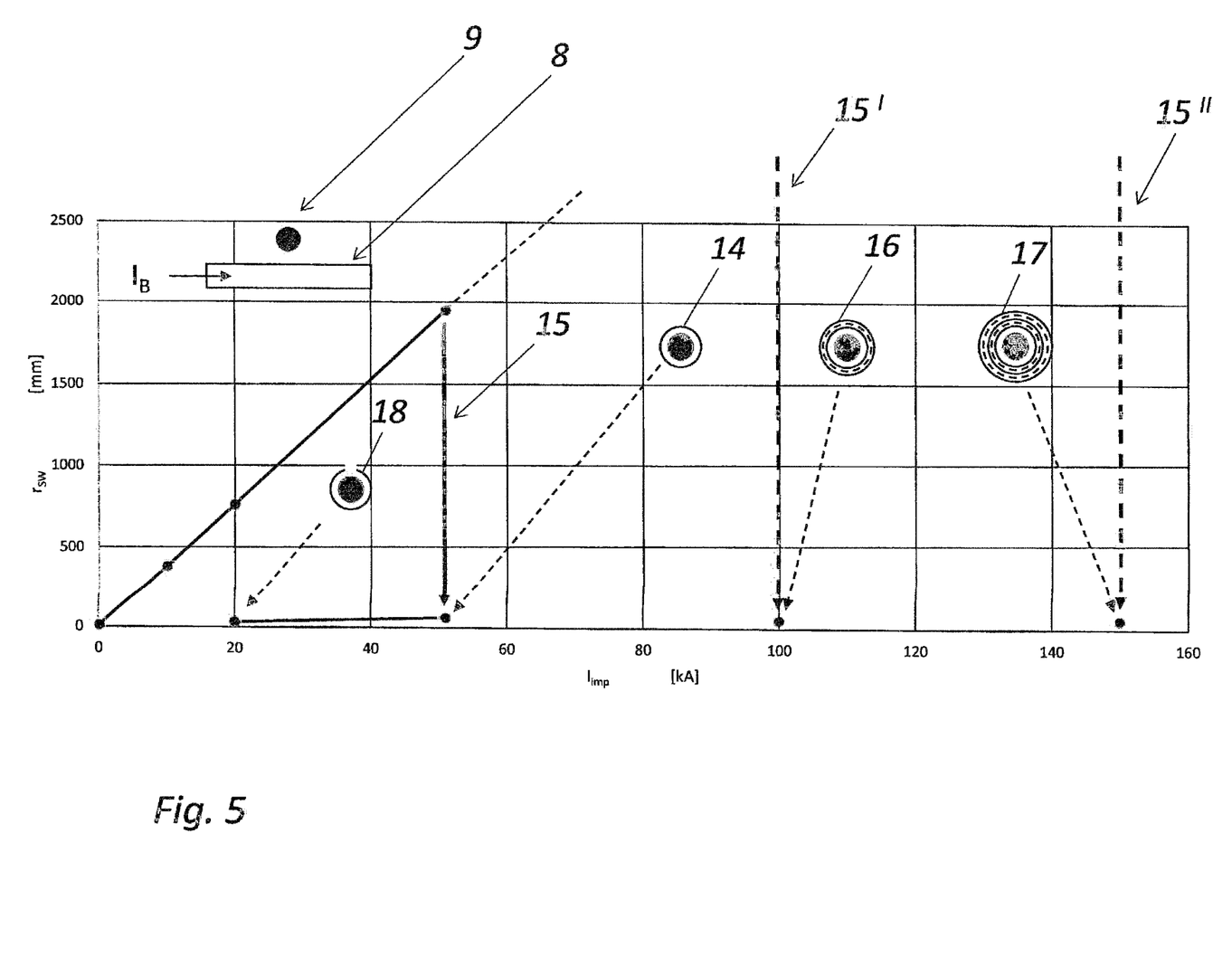
FIG. 5 shows a diagram highlighting the influence of a distance of a reed contact from a conductor cable on the level of a lightning current which is necessary to close said reed contact.

According to FIG. 5, the operating mode of the mentioned shield is explained by way of example.

In the representation, the distance $r_{sw}$ of the sensor 9 from the conductor cable 8 is delineated in millimeters, up to which distance an unshielded reed contact 9 having a sensitivity of about 15 AT will still close depending on the level of the lightning currents.

An experimentally determined progress with delineated measurement points (shade of grey) makes it obvious that, in case of desired threshold values of 200 kA or higher, the reed contact should be mounted at a distance of several meters from the conductor cable.

It becomes clear that already at relatively low lightning currents of only 20 kA, a considerable distance of about 75 cm should be observed, when the exceeding of such a current level in the conductor cable 8 should be detected.

At very high current threshold values, a compact measurement arrangement or a measurement arrangement constructed in a housing can hardly be realized. Reed contacts of higher insensitivity shift these distances only marginally and include the disadvantage of temporally allocating the closing to the actual current event. The orientation of the reed contact into an insensitive position toward the conductor cable, is highly sensitive in terms of positioning and attachment and involves very high constructional demands regarding the structure of corresponding devices and their installation.

According to FIG. 5, a structurally identical reed contact is used, for example with a steel tube of a wall thickness in the range of one up to a few millimeters. This is illustrated by reference numeral 14 in a simplified manner. The arrow 15 shows the action of this simple arrangement or of the distance in case of which the current source (current >50 kA 10/350 µs) can be detected. From about 2 m distance of the unshielded reed contact or sensor, the distance shifts to a few millimeters or centimeters.

In case of even higher pulse currents, a double shield 16 or triple shield 17 may also be used instead of a simple shield.

In this case, the shields, for example, and the steel tubes are separated by intermediate layers or air.

In these examples and in case of the same reed contact, the distance for detecting the threshold values of current >100 kA or >150 kA is reduced from a range of several meters to a few centimeters.

It becomes obvious that very compact devices can be realized for detecting very different current thresholds using the idea of the shield. The reed contacts or such employed sensors may be configured, when the same reed contacts and the same distance from the conductor cable are used, due to the use of different shields, for a plurality of different threshold values of the pulse currents.

Complementarily, there is the possibility of partially reducing the shield or introducing an opening into the shield. A grid-like or mesh-like shield could also be used in this respect. This measure does not only allow orientation characteristics to be realized. Rather, the sensitivity can be influenced even with the same geometry of the shield.

The shield 18, basically corresponding to the geometry of the simple shield 14, had been provided with a partial opening, whereby a current threshold of 20 kA at a distance of a few millimeters can be detected in FIG. 5. If the simple shield without the weakening 14 was used, this current threshold possibly could not be realized technically due to the too strong shielding.

The action of the shield by a ferromagnetic material is based in this case on the higher permeability of the shielding material. The magnetic field lines are deflected until the saturation of the material is reached, whereby the magnetic field in the area of the reed contacts is weakened substantially and thus closing of the reed contact is prevented until the saturation of the shield is reached.

Apart from the selection of the ferromagnetic material or the combination of such materials as well as of their magnetic properties, the action of the shield can be influenced by the geometry and positioning of the reed contact within the shield.

This thus results in a multitude of options to adapt the shield for using reed contacts to the task of detecting and evaluating long-term currents or pulse currents in compact devices or arrangements.

The invention claimed is:

1. A device for detecting electrical currents on or in the vicinity of an electrical conductor with at least one reed contact as a magnetically responsive switch, which is arranged in the vicinity of the electrical conductor such that, when there is a significant current flow of more than 50 A up to 200 kA through the conductor, the developing magnetic field triggers the switch and initiates an evaluation electronics connected to the switch, characterized in that for detecting surge current variables and differentiating long-term pulse currents, on the one hand, and short-time pulse currents, on the other, a plurality of reed contacts (4; 5; 6) is arranged in a predefined distance from the electrical conductor (8), wherein the evaluation electronics (2) determines the response and the switching times of the respective reed contacts (4; 5; 6), from the allocation of the determined values to the respective reed contact, the surge current variable is detected, and from the switching time, the pulse shape is detected, wherein, for setting the response behavior, at least one of the reed contacts (9) has a shield for influencing the magnetic field (B) acting upon the respective reed contact (9).

2. The device according to claim 1, characterized in that the electrical conductor is an integral part of a lightning current arresting system or an arrester rod.

3. The device according to claim 1, characterized in that the electrical conductor is an integral part of a surge current-carrying overvoltage arrester.

4. The device according to claim 1, characterized in that the evaluation electronics (2) has a microcontroller (100) and at least one low-pass filter (90).

5. The device according to claim 4, characterized in that the data is transferred in a wireless or wired manner to a superordinate unit for long-term analysis of pulse-shaped surge currents.

6. The device according to claim 4, characterized in that a radio module (111; 140) is provided for data transmission, wherein the data transmission is only triggered after expiration of a predetermined period of time after the last surge current pulse has decayed.

7. The device according to claim 1, characterized in that it has an autonomous long-term current supply (3; 50).

8. The device according to claim 1, characterized in that at least the reed contacts (4; 5; 6) are fixed on a planar wiring carrier.

9. The device according to claim 8, characterized in that the angular position of the groups of reed contacts (4; 5; 6) with respect to the electrical conductor (8) is fixedly predefined.

10. The device according to claim 1, characterized in that a housing accommodating the components of the device is formed, which housing has a front or side surface provided with means for identifying the position of and/or attaching the electrical conductor (8).

11. The device according to claim 1, characterized in that it is in each case arranged on or in the vicinity of lightning arrester cables of rotor blades in wind turbines.

12. The device according to claim 1, characterized in that after expiration of a predetermined or settable period of time between the pulse event and data transferal, a time stamp can be generated.

13. The device according to claim 1, characterized in that the electrical conductor (8) is an integral part of constructional parts or facilities, that do not carry lightning current, in particular of hoisting cables or carrier cables of cableways or cranes.

14. Use of a device according to claim 1 for detecting and classifying lightning current and overcurrent events having a surge current character in the range from $\geq 50$ A to 200 kA and pulse shapes as a long-term pulse with $T \geq 10$ ms as well as pulse shapes of 10/350 μs and 8/20 μs.

* * * * *